United States Patent [19]
Genov

[11] Patent Number: 6,085,125
[45] Date of Patent: Jul. 4, 2000

[54] PREALIGNER AND PLANARITY TEACHING STATION

[75] Inventor: Genco Genov, deceased, late of San Jose, Calif., by Mila Genov, legal representative

[73] Assignee: Genmark Automation, Inc., Sunnyvale, Calif.

[21] Appl. No.: 09/075,697

[22] Filed: May 11, 1998

[51] Int. Cl.[7] .................................................. B25J 9/00
[52] U.S. Cl. ................. 700/218; 414/222; 414/744.1; 901/3; 901/9; 901/16; 901/30
[58] Field of Search ............................... 901/2, 3, 9, 16, 901/30, 85, 47; 364/478.06, 478.01; 414/225, 744.6, 744.8, 729, 222, 744.1

[56] References Cited

U.S. PATENT DOCUMENTS

| | | | |
|---|---|---|---|
| 5,004,399 | 4/1991 | Sullivan et al. | 414/729 |
| 5,409,348 | 4/1995 | Suzuki | 414/786 |
| 5,456,561 | 10/1995 | Poduje et al. | |
| 5,645,391 | 7/1997 | Ohsawa et al. | 414/416 |
| 5,711,646 | 1/1998 | Ueda et al. | 414/225 |
| 5,730,574 | 3/1998 | Adachi et al. | 414/222 |
| 5,740,059 | 4/1998 | Hirata et al. | 364/478.01 |
| 5,788,477 | 8/1998 | Yonemitsu et al. | 414/217 |
| 5,788,868 | 8/1998 | Itaba et al. | 216/41 |
| 5,789,890 | 8/1998 | Genov et al. | 901/2 |
| 5,810,935 | 9/1998 | Lee et al. | 118/728 |
| 5,822,498 | 10/1998 | Kumasa et al. | 395/87 |

*Primary Examiner*—Christopher P. Ellis
*Assistant Examiner*—Khoi H. Tran
*Attorney, Agent, or Firm*—Burns Doane Swecker and Mathis, LLP

[57] ABSTRACT

A planarity teaching station includes one or more proximity sensors arranged to reflect light off a surface to determine a plane in which a substrate is positioned by a robotic arm. The plane of the substrate is then automatically adjusted by changing a Z-axis of a universally tiltable robot base or in another manner, based on the data provided by the planarity teaching station. The adjustment of the substrate or end effector plane allows substrates to be removed from and delivered to various cassettes and workstations of a substrate processing system without damage to the substrate caused by end effector misalignment.

12 Claims, 4 Drawing Sheets

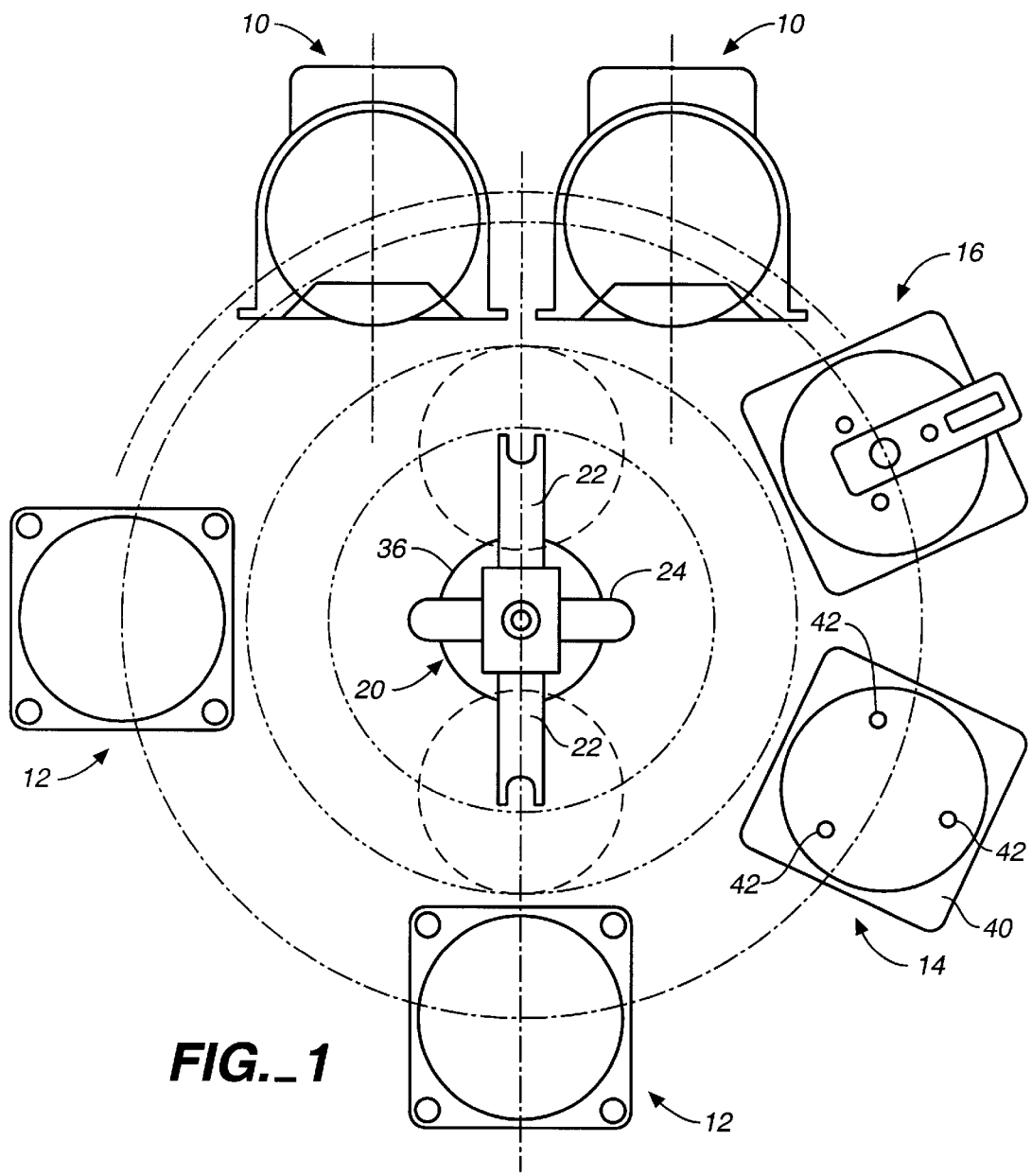
FIG._1

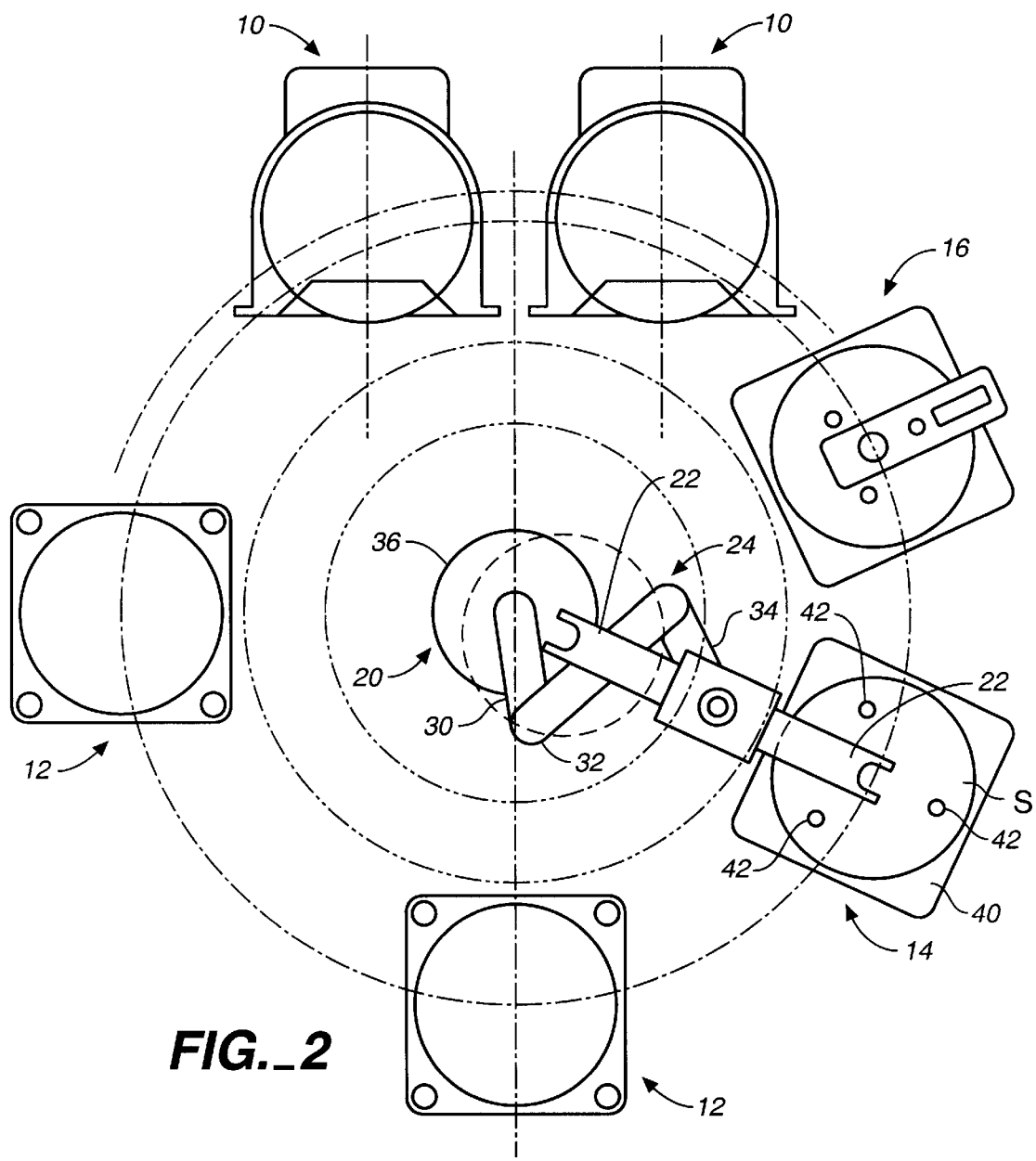
FIG._2

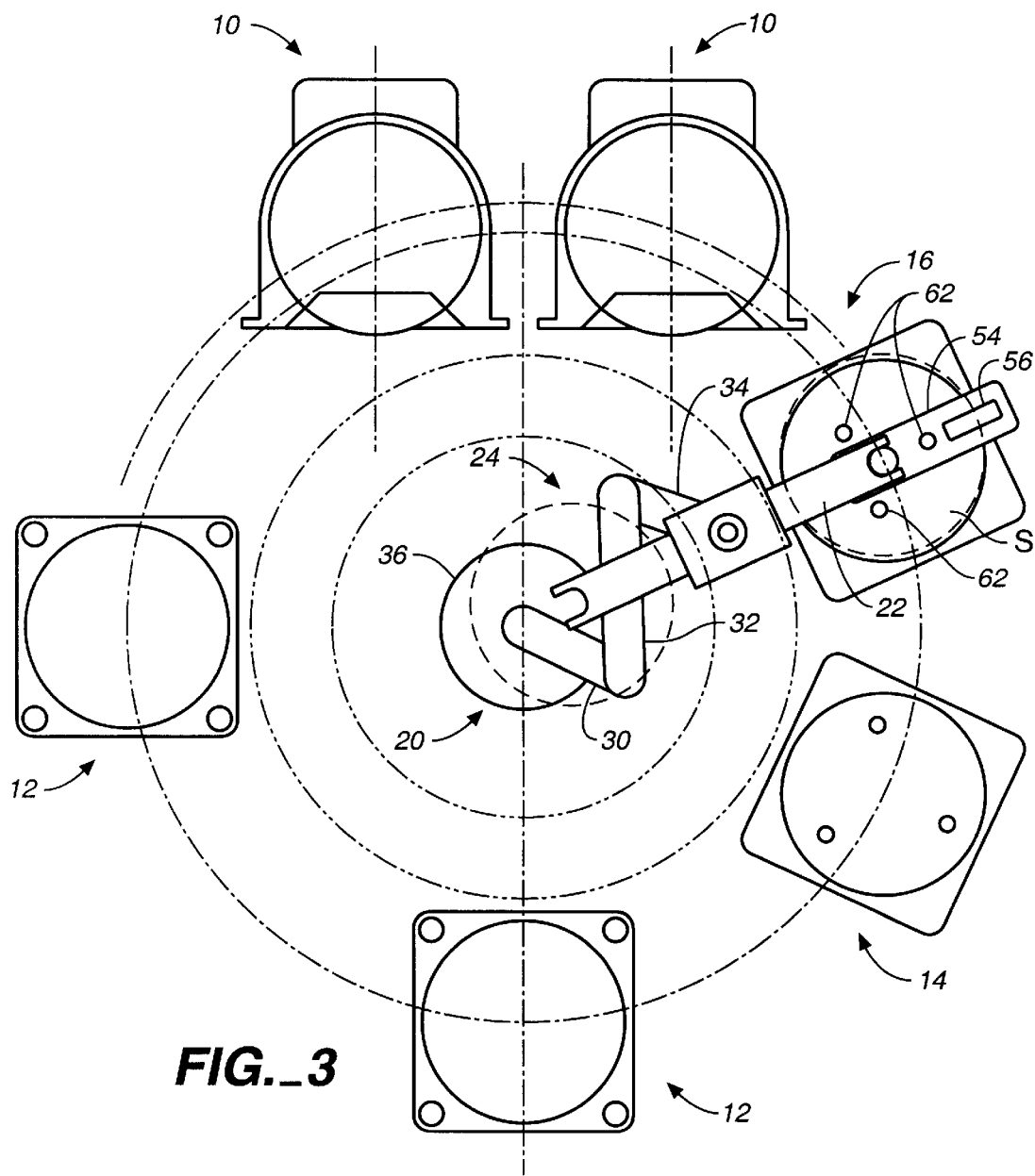
FIG._3

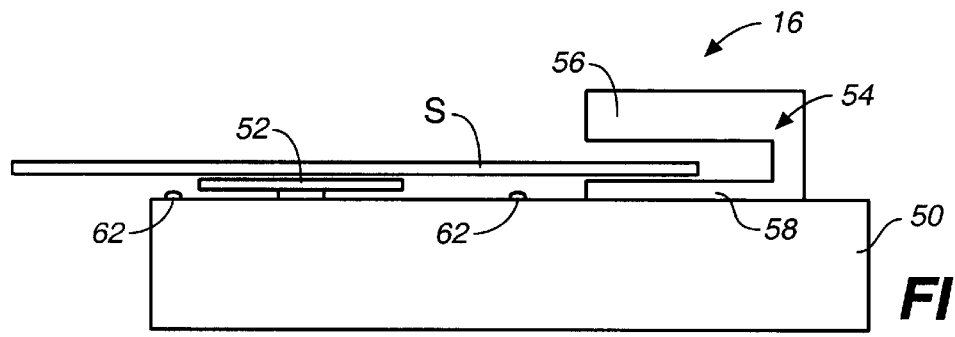
FIG._4
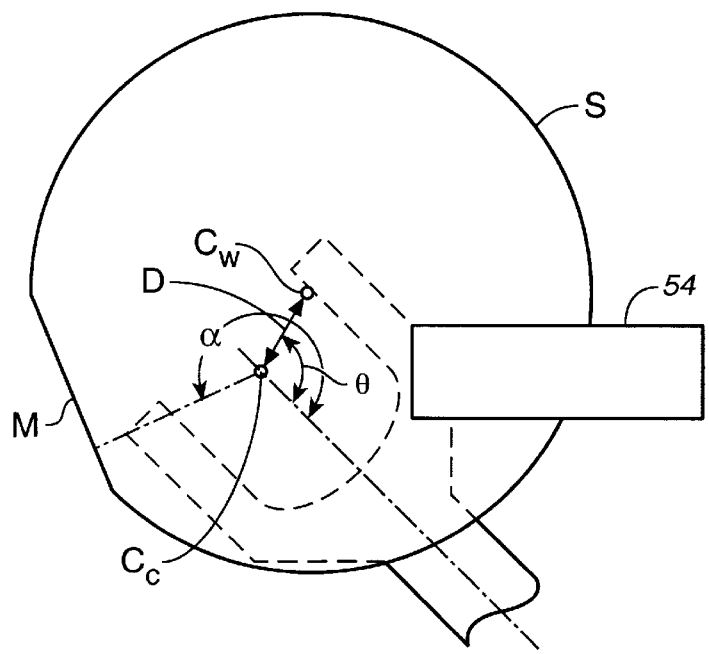
FIG._5
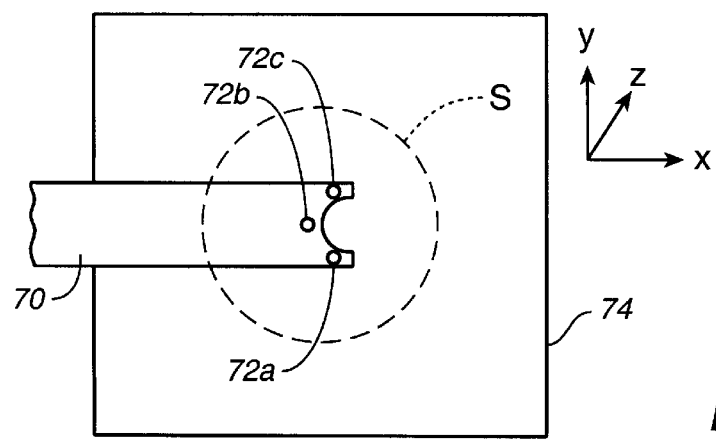
FIG._6

PREALIGNER AND PLANARITY TEACHING STATION

BACKGROUND OF INVENTION

1. Field of the Invention

The invention relates to an apparatus and method for performing alignment in the semiconductor transporting and processing fields, and more particularly, the invention relates to an apparatus and process for aligning a transported substrate or an end effector of a robot arm with a substrate cassette, processing station, or any other substrate workstation.

2. Brief Description of the Related Art

In the semiconductor wafer and flat panel display processing fields, robot arms are used in moving substrates including semiconductor wafers, flat panels, reticles, and the like, to and from cassettes and workstations where various processing steps take place. The robot end effector and the workstations or cassettes where the substrates are held must be properly aligned with one another so that the substrates can be transferred and positioned properly without damage.

Several different types of robot linkages are known in the art. These linkages include telescoping arms, rotatable link arms, and isosceles triangle-type linkages. Pulleys, belts, and motors are generally utilized to move the links of the robot arm with respect to one another and to move a robot end effector or hand located at the end of the arm which is used to grasp and transport a substrate. In use, the robot arm is extended to pick up a substrate located in a cassette or at a workstation with the end effector, generally by suction. The arm is then retracted and rotated to the position of another cassette or workstation. The robot arm carrying the substrate is then advanced to another cassette or workstation where the substrate is deposited.

Prealigning is a process of dealing with a problem of angular and linear misalignment of a substrate by orienting and centering the substrate on the robot end effector. This problem is particularly prevalent when dealing with flat panel displays because the flat panels are often present in cassettes with a certain degree of angular and linear misalignment. During prealignment, the substrate is oriented and centered so that a mark such as a flat or notch of the substrate is set at a predefined angled and a center of the substrate is positioned at a predefined location on the end effector. Prealigning ensures that successively processed substrates are all oriented with the mark in the same direction and are centered during processing. Prealigning is generally achieved by placing a substrate on a chuck having light sensors such as CCD sensors and using the chuck to rotate the substrate to detect the misalignment. The chuck then may be used to center and align the substrate on the robot end effector. Alternatively, the robot end effector alone may be used to center the substrate on the chuck, or a combination of the robot and the chuck may be used.

Another problem occurring during manipulation of substrates, including semiconductor wafers and flat panels, is that the Z-axis of the robotic arm end effector may not be completely parallel to the axis of a cassette or workstation at which the substrate is positioned. The relative tilt between the robot end effector and the cassette or workstation may be only a few degrees. However, this misalignment prevents the end effector from being able to properly approach and pick up the substrate and properly place the substrate in a cassette or workstation.

Adjustment of the Z-axis of a robotic arm is also useful when transporting large substrates which may deflect the robot arm slightly downward due to the substrate weight. An adjustable Z-axis platform may be used to compensate for deflections of the robot arm under the weight of a substrate to align the substrate with a workstation or cassette.

Robot arms having universally tiltable Z-axes to accommodate this misalignment are disclosed in U.S. patent applications Ser. No. 08/661,292, filed Jun. 13, 1996; Ser. No. 08/788,898, filed Jan. 23, 1997; Ser. No. 08/889,907, filed Jul. 10, 1997; and Ser. No. 09/072,708, filed May 5, 1998, each of which is incorporated herein by reference in its entirety. Although the universally tiltable Z-axis robot allows the robot to be tilted to achieve alignment, the degree of tilt needed must first be determined.

With prior art robotic arms for processing substrates, the longitudinal axes of the cassettes and workstations are aligned with the robot end effector by manual measurement. The process of manually aligning the robot with the workstations and cassettes each time the robot is replaced or moved for some reason is quite time consuming. However, if it is possible to automatically change the Z-axis of the robotic arm to correspond to a detected orientation of the workstations and cassettes, the set up time can be greatly reduced.

Although it is possible with the universally tiltable Z-axis robots to align the robot arm with a particular workstation or cassette, there is no convenient manner for determining the amount of tilt of the Z-axis required to achieve alignment. Accordingly, it would be desirable to be able to achieve alignment between the Z-axis of a robotic arm end effector and a workstation or cassette automatically.

SUMMARY OF THE INVENTION

The present invention relates to a robot alignment system and an alignment station for aligning an end effector of a substrate transporting robot with at least one cassette or workstation. The alignment station includes sensors for determining a plane in which the substrate is held by the end effector of the robot.

In accordance with one aspect of the present invention a robot alignment system for aligning an end effector of a substrate transporting robot with at least one cassette or workstation includes a robot having an end effector for transporting a substrate, and an alignment station having a proximity sensing system for sensing information about the proximity of the end effector or a substrate held on the end effector to the alignment station. The end effector has a Z-axis which is perpendicular to a plane of the substrate when the substrate is mounted on the end effector. Means for adjusting the orientation of the Z-axis of the robot end effector in accordance with the information provided by the proximity sensing system are provided to achieve alignment between the robot end effector and the at least one cassette or workstation.

In accordance with another aspect of the present invention, an alignment station for determining an adjustment for aligning a substrate or a robotic arm end effector with a cassette or workstation in which the substrate is received includes a plurality of proximity sensors arranged in a known plane, the proximity sensors outputting signals indicating a distance between each of the sensors and a closest point on the substrate or the end effector. Means are provided for determining planarity information indicative of correction action needed to align the substrate or the end effector with the cassette or workstation. The planarity information is determined from the signals output by the plurality of proximity sensors and is out to a robot for alignment of a Z-axis of the robot end effector.

In accordance with a further aspect of the present invention, a method of aligning an end effector of a substrate transporting robot with at least one cassette or workstation includes the steps of transporting a substrate to a planarity teaching station with an end effector of a robot, sensing a planarity of the substrate with a proximity sensing system of the planarity teaching station, and adjusting an orientation of a Z-axis of the robot end effector in accordance with the sensed planarity of the substrate to achieve a predetermined plane of the substrate which is properly aligned with the at least one cassette or workstation.

According to an additional aspect of the present invention, an alignment system for aligning an end effector of a substrate transporting robot with at least one cassette or workstation includes a movable robot arm, an end effector located on an end of the robot arm for transporting a substrate, the end effector having a Z-axis which is perpendicular to a plane of the substrate when the substrate is mounted on the effector, a proximity sensing system on the end effector for sensing the proximity of the end effector to an alignment surface, and means for adjusting the orientation of the Z-axis of the robot end effector based on information provided by the proximity sensing system to achieve alignment between the robot end effector and the at least one cassette or workstation.

According to a further aspect of the present invention, a method of aligning an end effector of a substrate transporting robot with at least one cassette or workstation includes the steps of: advancing an end effector of a robot or substrate supported on an end effector toward an alignment surface; sensing a difference in planarity between the end effector or substrate and the alignment surface by one or more proximity sensors; and adjusting an orientation of a Z-axis of the robot end effector in accordance with the sensed difference in planarity to align the end effector or substrate with the at least one cassette or workstation.

In accordance with another aspect of the present invention, a method of prealigning a substrate on the end effector of a robotic arm mechanism includes the steps of: providing end effector having at least two proximity sensors; advancing the end effector toward a substrate in a direction which is substantially parallel to a surface of the substrate; activating each of the proximity sensors as the substrate reaches a sensing distance to each of the proximity sensors; calculating a position of the substrate based on information provided by the proximity sensors; and prealigning the substrate on the end effector based on the calculated position of the substrate.

BRIEF DESCRIPTION OF THE DRAWINGS

The invention will now be described in greater detail with reference to the preferred embodiments illustrated in the accompanying drawings, in which like elements bear like reference numerals, and wherein:

FIG. 1 is a schematic top view of a substrate processing system with a robot in a retracted position;

FIG. 2 is a schematic top view of the substrate processing system with a substrate positioned by the robot at a planarity teaching station;

FIG. 3 is a schematic top view of the substrate processing system with the robot positioning the substrate at a prealignment station;

FIG. 4 is a side view of a combination prealigner and planarity teaching station having a substrate supported on the chuck;

FIG. 5 is a top view of a misaligned substrate and an end effector of a robot positioned at a prealigner station; and FIG. 6 is a top view of an alternative embodiment of a planarity teaching system.

DETAILED DESCRIPTION OF THE PREFERRED EMBODIMENT

A substrate processing system according to the present invention includes one or more cassettes 10, one or more substrate processing workstations 12, a planarity teaching station 14, a prealigner station 16, and a robot 20 for transferring a substrate between the various stations and cassettes. The robot 20 illustrated in FIG. 1 includes two end effectors 22 both positioned on an end of a robotic arm 24 and each being capable of grasping and moving a substrate. As shown most clearly in FIGS. 2 and 3, the robotic arm 24 is formed of three links 30, 32, 34. A distal most link 34 of the robotic arm 24 supports to the end effectors 22. The robotic arm 24 may be driven by a series of belts and pulleys as described in U.S. Pat. No. 5,064,340, which is incorporated herein by reference, or by any other known drive mechanism.

In order to properly place or remove substrates from the cassettes 10 or place or remove substrates from one of the substrate processing workstations 12, a Z-axis of the robot end effector 22 must be aligned with an axis of the cassette or workstation. The robot end effector Z-axis is perpendicular to a plane of the substrate when the substrate is positioned on the end effector. The Z-axis of the end effector 22 is generally perpendicular to an overall Z-axis of the robot about which the robotic arm 24 rotates on the base 36 of the robot. However, the end effector 22 may also be at an angle to the overall robot Z-axis. The axis of any one of the workstations 12 or cassettes 10 is defined as a line perpendicular to a plane in which the substrate lies when the substrate is in a preferred position within the workstation or cassette.

The alignment of the end effector Z-axis with the axes of the cassettes 10 and workstations 12 is necessary to prevent damage to the substrate which may occur if a misaligned robot end effector transporting a substrate causes the substrate to come into contact with an obstacle such as a wall of a cassette or workstation. In addition, the substrate may be damaged by the end effector 22 if a misaligned end effector strikes an edge of the substrate while attempting to pick up the substrate.

In order to address these problems of misalignment of the robot end effector Z-axis with the axes of the cassettes 10 and workstations 12 the present invention includes a planarity teaching station 14 which detects a plane of the substrate on the end effector 22 and transmits information about the plane of the substrate and end effector to the robot controller for use in adjustment of the robot Z-axis. The robot 20 is mounted on a universally tiltable platform or base 36 which allows the Z-axis of the robot to be adjusted by the robot controller in accordance with the information from the planarity teaching station. The adjustment of the robot Z-axis allows the end effector Z-axis to be aligned with the axes of the cassettes 10 and workstations 12. The universally tiltable Z-axis platform 36 may be any of those known in the art which are capable of tilting the Z-axis of the robot 20 in at least two directions.

The planarity teaching station 14 includes a base 40 which is arranged either as parallel as possible to base planes of the cassettes 10 and workstations 12 and a base plane of the robot 20, or at a predetermined angle to the cassettes and workstations. This alignment of the base 40 of the planarity teaching station 14 to the workstations 12 cassettes 10, and/or the robot 20 can be accomplished by fixing the teaching station, robot, workstations, and cassettes all to the same planar table top or other reference plane.

The planarity teaching station 14 according to one embodiment of the invention includes three proximity sensors 42 arranged on the base 40 in a spaced apart arrangement. For purposes of simplicity, the sensors 42 are preferably arranged in an equilateral triangle arrangement. Each of the proximity sensors 42 include a source of illumination and a light detector. The light from the proximity sensor in this embodiment is reflected off a surface and detected by the light detector when the reflecting surface is within a certain predetermined distance from the proximity sensor. The proximity sensors are on/off devices which are able to determine by detecting reflected light, when an object has approached within a predetermined distance to the sensor. Although the teaching station 14 is described as teaching planarity of a substrate positioned on an end effector, the teaching station may also determine planarity of the end effector alone prior to picking up a substrate.

In operation of this embodiment of a planarity teaching station, the substrate S is picked up or grasped by the robot end effector and moved to a position above the planarity teaching station 14. The substrate S is located by the robot such that a portion of the substrate is above each of the proximity sensors 42. The substrate S is then lowered toward the teaching station 14 with the robot. The substrate S is lowered by the robot in a direction which is generally parallel to the end effector Z-axis. The three proximity sensors 42 of the planarity teaching station 14 reflect light off a lower surface of the substrate S as the substrate approaches the base 40 of the teaching station in a generally downward direction. As the substrate S approaches the planarity teaching station 14 each sensor 42 determines when an adjacent portion of the substrate reaches a certain proximity to the sensor. Each of the sensors 42 sends a signal representative of the proximity of the adjacent portion of the substrate to the sensor to the robot controller. The robot 20 continues to move the substrate S downward in a direction substantially parallel to the end effector Z-axis until all three of the proximity sensors 42 have registered or detected the proximity of an adjacent portion of the substrate. The signals received from the three sensors 42 allow the determination of a plane in which the substrate S is positioned. The sensor 42 which first detects the substrate S is determined to be closest to the substrate, while the sensor which is the last to detect the proximity of the substrate is determined to be the farthest from the substrate.

The determination of the plane in which the substrate S is positioned may be made by the planarity teaching station 14 itself or by a separate robot controller connected to the planarity teaching station. Although the operation of the planarity teaching station 14 has been described as sensing a proximity of three locations on a substrate S, the alignment of the robot can also be performed by sensing a proximity of three locations on the end effector 22 or the robot arm 24 in a similar manner. Further, more than three proximity sensors 42 can also be used. One example of an optical proximity sensor for use in the present invention is an optical proximity sensor commercially available from Honeywell, Inc., of Minneapolis, Minn.

In place of the three proximity sensors 42 described above, other types and configurations of sensors may also be used. For example, a planar CCD sensor may be used in combination with a light source. The light from the light source is reflected off the substrate or the end effector and the reflected light is detected by the CCD sensor. The inclination of the substrate or end effector is determined by a location of the reflected light which is detected on the CCD sensor. For example, if the light from the light source positioned on a planar CCD sensor is reflected directly back to the light source, the plane of the substrate or end effector can be determined to be substantially parallel to a plane of the CCD sensor.

Other examples of light sensors for use in the planarity teaching station 14 include two linear CCD sensors, one linear CCD sensor in combination with one or more proximity sensor, or one rotating proximity sensor. Mechanical contact proximity sensors, laser proximity sensors, or inductive proximity sensors may also be used.

As an alternative to mounting the proximity sensors 42 on a base 40 and moving the substrate or end effector toward the base to determine planarity, the sensors can be mounted on the robot end effector 22. FIG. 6 illustrates an alternative embodiment of a planarity teaching system with an end effector 70 having three proximity sensors 72$a$, 72$b$, 72$c$ mounted on either an upper or a lower surface of the end effector. The end effector 70 of FIG. 6 operates as a planarity teaching station in combination with an alignment surface 74. In operation, as the upper or lower surface of the end effector 70 with the proximity sensors 72$a$, 72$b$, 72$c$ is moved (in the Z-direction) toward a simple planar shaped alignment surface 74 the proximity sensors each independently indicate when the end effector surface is within a certain proximity to the plate shaped alignment surface 74 of the teaching station. The planarity of the end effector 70 can be corrected based on the information provided by the proximity sensors 72$a$, 72$b$, 72$c$. If the proximity sensors 72$a$, 72$b$, 72$c$ are mounted on the lower surface of the end effector 70 the planarity of the end effector can be measured by lowering the end effector toward the planar surface 74. The planarity may be determined with or without a substrate S supported on the end effector 70. The proximity sensors 72$a$, 72$b$, 72$c$ on the end effector 70 according to this embodiment may take different forms, such as, planar or linear light sensors, CCD sensors, or contact sensors.

The end effector 70 having proximity sensors 72$a$, 72$b$, 72$c$ on an upper surface may also be used as a type of prealigner for aligning the substrate S on the end effector. In particular, as the end effector 70 approaches a substrate in a direction substantially parallel to the substrate surface (the X-direction), the proximity sensors 72$a$, 72$b$, 72$c$ will each be activated at different times when the substrate reaches sensing distance to each of the sensors. As the end effector 70 passes beneath the substrates the proximity sensors 72$a$, 72$b$, 72$c$ will be activated in a sequence which is used by the robot's controller to calculate the position of the substrate within certain tolerances. This dynamic position determination is then used for prealigning of the substrate on the end effector.

According to an alternative embodiment of the invention, the end effector 70 may include proximity sensors on both sides of the end effector. For example, three sensors may be provided on each side for a total of six sensors. This embodiment has the advantage of allowing alignment with either side of the end effector depending on the setup of the alignment or reference surface. In addition, the sensors on both sides of the end effector can be used to protect the substrates when the end effector is positioned inside the slots of a workstation or cassette by sensing the proximity of the end effector to a substrate either above or below the end effector.

Once a plane of the substrate S has been determined by the planarity teaching station 14 or the planarity teaching station in combination with a controller, the plane of the substrate is adjusted to achieve a predetermined plane for delivery of the substrate to a workstation 12 or cassette 10. The adjustment of the orientation of the substrate and the end effector may be accomplished in several different ways including the use of a universally tiltable Z-axis platform, a universal wrist, robot arm with an additional degree of freedom, or any combination of these systems. For example, the adjustment may be accomplished with a universally tiltable platform by changing the Z-axis orientation of the robot base 36 to align the end effector Z-axis with the axes of the workstations 12 and cassettes 10. The alignment of the substrate S and end effector 22 may be accomplished in either a single step or in multiple steps by repeating the proximity sensing operation to achieve greater precision of the Z-axis alignment.

As an alternative to the use of the planarity teaching station 14, the prealigner station 16 may be used for both prealigning of the substrate S and for determining the plane of the substrate or end effector 22 for alignment of the robot Z-axis. FIG. 3 illustrates the positioning of a substrate S at the prealigner station 16 by the robot 20. The prealigner 16 is capable of adjusting the rotational and linear position of the substrate S on the robot end effector 22 as well as determining the plane of the substrate for alignment of the substrate or end effector Z-axis. Although FIGS. 1–3 illustrate a substrate processing system including both a prealigner 16 and a planarity teaching station 14, when the prealigner operates as a planarity teaching station, the planarity teaching station may be omitted.

Prealigning is a process of orienting and centering a substrate so that a mark M of the substrate is set at a predefined angle and a center $C_w$ of the substrate is in a predefined place. As shown in FIG. 4, the prealigner 16 includes a body 50, a rotatable chuck 52, and a lighthouse 54. The prealigner 16 may also include lifting pins which lift the substrate up off the chuck 52 for realignment. Alternatively, the end effector 22 of the robot may be used to lift the substrate off the chuck 52 instead of pins during realignment.

The lighthouse 54 includes a light source 56 positioned on one side the substrate S and a light sensor 58, such as a linear CCD sensor, positioned on an opposite side the substrate. The substrate S is placed on the chuck 52 by the robot 20 and the chuck rotates the substrate. The portion of the substrate S which is situated between the light source 56 and the light sensor 58 casts a shadow. During rotary motion of the substrate S by the chuck 52 the light sensor 58 generates a signal proportional to the length of the substrate shadow. A controller collects the data from the light sensor 58 at regular intervals and based on this information determines a displacement length D, a displacement angle θ, and a flat angle α. The displacement length D is the distance between the geometric center of the wafer $C_w$ and the center of the chuck $C_c$. The displacement angle θ is the angle between a line connecting the geometric center of the wafer $C_w$ to the chuck center $C_c$ and the longitudinal axis of the end effector 22. The flat angle α is the angle between the longitudinal axis of the end effector 22 and a line connecting the substrate mark M or flat surface to the chuck center $C_c$. The prealigner 16 can center and align the substrate on the end effector 22 in a single step or in a multiple step manner.

The prealigner station 16 according to the present invention includes three proximity sensors 62 which allow the prealigner to function as a planarity teaching station. The proximity sensors 62 are arranged and operate in a manner similar to the proximity sensors 42 of the planarity teaching station 14 shown in FIG. 2. In operation, the substrate S is picked up or grasped by the robot end effector 22 and transported to the prealigner 16 where an edge of the substrate is positioned between the light source 56 and the light sensor 58. The substrate S is then moved by the end effector 22 in a downward direction toward the proximity sensors 62 positioned on the base 50. The proximity sensors 62 provide a signal when an adjacent portion of the substrate S comes within a predetermined proximity of the sensors. The information from the proximity sensors 62 is used to determine the plane of the substrate S and to adjust the substrate plane to a desired substrate plane by tilting the Z-axis of the robot.

The prealigner station 16 may perform prealignment of the substrate before or after the plane of the substrate and end effector has been adjusted by adjustment of the robot end effector Z-axis. Although the planarity teaching process of the present invention has been illustrated as being combined with the prealigner, it should be understood that the planarity teaching station may also be combined with other stations of the substrate processing system such as a cassette or workstation.

According to one embodiment of the present invention, the cassettes 10 and workstations 12 are all roughly aligned with one another and the planarity teaching station is used for alignment of the robot end effector Z-axis with the axes of the workstations and cassettes. Each time the robot is replaced or moved, for example, during routine maintenance, the robot end effector Z-axis is prealigned by use of the planarity teaching station. In addition, if the robot arm is deflected by the weight of the substrate, the planarity of the end effector should be determined by the planarity teaching station after the substrate has been picked up by the end effector.

Although the present invention has been illustrated as employing a three link robotic arm 24 with a double end effector 22, it should be understood that many other robot and end effector configurations may be used without departing from the present invention. For example, the robotic arm 24 may include different numbers of links or may have a different construction all together such as a parallelogram linkage. Further, the robot 20 may have a single end effector 22 or more than one end effector and the multiple end effectors may be stationary or movable with respect to each other.

In operation, the planarity teaching station 14 or the prealigner 16 determines a plane of the substrate or end effector by use of a proximity sensing system which may include three or more proximity sensors 42, 62, linear or planar CCD sensors, or other proximity sensors. The plane of the substrate or end effector is then automatically adjusted by changing a Z-axis of the robot 20 with the universally tiltable Z-axis platform 36 or by another manner based on the data gathered by the prealigner. An independent step of calculating the plane of the substrate or end effector is not required, as long as the amount of correction needed to provide alignment can be calculated from the information provided by the planarity teaching station.

The adjustment of the substrate or end effector plane allows the substrates to be removed from and delivered to the various cassettes 10 and workstations 12 of the substrate processing system without damage to the substrate. The invention is particularly applicable to transportation and processing of semiconductor wafers, flat panel displays, and reticles, but may also be used for other types of substrates.

While the invention has been described in detail with reference to the preferred embodiments thereof, it will be apparent to one skilled in the art that various changes and modifications can be made and equivalents employed, without departing from the present invention.

What is claimed is:

1. A robot alignment system for aligning an end effector of a substrate transporting robot with at least one cassette or workstation, the alignment system comprising:

a robot having an end effector for transporting a substrate, the end effector having a Z-axis which is perpendicular to a plane of the substrate when the substrate is mounted on the end effector;

an alignment station having a proximity sensing system for sensing information about the proximity of the end effector or a substrate held on the end effector to the alignment station; and means for adjusting the orientation of the Z-axis of the robot end effector in accordance with the information provided by the proximity sensing system to achieve alignment between the robot end effector and the at least one cassette or workstation;

wherein the alignment station performs prealigning of the substrate by adjusting a position of the substrate on the robot end effector.

2. An alignment system for aligning an end effector of a substrate transporting robot with at least one cassette or workstation, the alignment system comprising:

an alignment surface having a known alignment relationship with the cassette or workstation;

a movable robot arm;

an end effector located on an end of the robot arm for transporting a substrate, the end effector having a Z-axis which is perpendicular to a plane of the substrate when the substrate is mounted on the effector;

a proximity sensing system on the end effector for sensing the proximity of the end effector to the alignment surface; and means for adjusting the orientation of the Z-axis of the robot end effector based on information provided by the proximity sensing system and on the known alignment relationship to achieve alignment between the robot end effector and the at least one cassette or workstation.

3. The alignment system according to claim 2, wherein the proximity sensing system includes three optical proximity sensors arranged on a surface of the end effector.

4. The alignment system according to claim 3, wherein the three optical proximity sensors each independently indicate when the end effector surfaces are within a certain proximity to the alignment surface.

5. The alignment system according to claim 2, wherein the alignment surface is located on one of the cassettes or workstations.

6. The alignment system according to claim 2, further comprising means for prealigning the substrate on the end effector.

7. The alignment according to claim 2, wherein the proximity sensing system is positioned on a top of the end effector.

8. A method of prealigning a substrate on the end effector of a robotic arm mechanism, the method comprising:

providing an end effector having at least two proximity sensors;

advancing the end effector toward a substrate in a direction which is substantially parallel to a surface of the substrate;

activating each of the proximity sensors as the substrate reaches a sensing distance to each of the proximity sensors;

calculating a position of the substrate based on information provided by the proximity sensors; and prealigning the substrate on the end effector based on the calculated position of the substrate, the step of prealigning including picking up the substrate with the end effector with a known displacement between a center of the substrate and a center of the end effector.

9. The method according to claim 8, wherein the end effector is advanced in a plane which is below and substantially parallel with a plane of the substrate.

10. A method of prealigning a substrate on the end effector of a robotic arm mechanism and aligning the end effector with at least one cassette or workstation, the end effector having a Z-axis which is perpendicular to a plane of the substrate when the substrate is mounted on the effector, the method comprising:

providing an end effector having at least three proximity sensors;

sensing the proximity of the end effector to an alignment surface;

advancing the end effector in a direction substantially perpendicular to the alignment surface so as to sense planarity information of the end effector;

adjusting the orientation of the Z-axis of the robot end effector based on information provided by the proximity sensors to achieve alignment between the robot end effector and the at least one cassette or workstation;

advancing the end effector toward a substrate in a direction which is substantially parallel to a surface of the substrate based on the planarity information;

activating each of the proximity sensors as the substrate reaches a sensing distance to each of the proximity sensors;

calculating a position of the substrate based on information provided by the proximity sensors; and prealigning the substrate on the end effector based on the calculated position of the substrate.

11. The method according to claim 10, wherein the step of prealigning includes picking up the substrate with the end effector with a center of the substrate at a center of the end effector.

12. The method of claim 10, wherein the alignment surface is a surface of the substrate.

* * * * *